United States Patent
Balakrishna et al.

(10) Patent No.: US 8,075,728 B2
(45) Date of Patent: Dec. 13, 2011

(54) GAS FLOW EQUALIZER PLATE SUITABLE FOR USE IN A SUBSTRATE PROCESS CHAMBER

(75) Inventors: Ajit Balakrishna, Sunnyvale, CA (US); Shahid Rauf, Pleasanton, CA (US); Andrew Nguyen, San Jose, CA (US); Michael D. Willwerth, Campbell, CA (US); Valentin N. Todorow, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 540 days.

(21) Appl. No.: 12/038,887

(22) Filed: Feb. 28, 2008

(65) Prior Publication Data

US 2009/0218043 A1    Sep. 3, 2009

(51) Int. Cl.
```
C23F 1/00       (2006.01)
H01L 21/306     (2006.01)
C23C 16/455     (2006.01)
C23C 16/06      (2006.01)
C23C 16/22      (2006.01)
```
(52) U.S. Cl. ............. 156/345.26; 156/345.51; 118/715
(58) Field of Classification Search ............. 156/345.26, 156/345.51; 118/715
See application file for complete search history.

(56) References Cited

U.S. PATENT DOCUMENTS

| | | | |
|---|---|---|---|
| 5,639,334 A | 6/1997 | Canale et al. | |
| 6,660,126 B2 | 12/2003 | Nguyen et al. | |
| 6,716,287 B1 | 4/2004 | Santiago et al. | |
| 6,733,620 B1 * | 5/2004 | Sugiyama et al. | 156/345.29 |
| 6,797,108 B2 | 9/2004 | Wendling | |
| 6,878,206 B2 | 4/2005 | Tzu et al. | |
| 6,936,906 B2 | 8/2005 | Chung et al. | |
| 6,963,043 B2 * | 11/2005 | Fink | 219/121.43 |
| 6,998,014 B2 | 2/2006 | Chen et al. | |
| 7,175,713 B2 | 2/2007 | Thakur et al. | |
| 7,422,637 B2 | 9/2008 | Ku et al. | |
| 2002/0121241 A1 | 9/2002 | Nguyen et al. | |
| 2003/0116087 A1 | 6/2003 | Nguyen et al. | |
| 2004/0211665 A1 | 10/2004 | Yoon et al. | |
| 2007/0119370 A1 | 5/2007 | Ma et al. | |
| 2008/0035605 A1 * | 2/2008 | Takahashi | 216/58 |
| 2008/0099147 A1 | 5/2008 | Myo et al. | |
| 2008/0107809 A1 | 5/2008 | Wu et al. | |
| 2008/0202425 A1 | 8/2008 | Gelatos et al. | |

FOREIGN PATENT DOCUMENTS

| | | |
|---|---|---|
| JP | 2001-179078 | 7/2001 |
| KR | 20-1999-0127742 | 4/1999 |

OTHER PUBLICATIONS

PCT International Search Report for PCT/US2009/034533, dated Sep. 1, 2009.

* cited by examiner

*Primary Examiner* — Rudy Zervigon
(74) *Attorney, Agent, or Firm* — Patterson & Sheridan, L.L.P.

(57) ABSTRACT

A flow equalizer plate is provided for use in a substrate process chamber. The flow equalizer plate has an annular shape with a flow obstructing inner region, and a perforated outer region that permits the passage of a processing gas, but retains specific elements in the processing gas, such as active radicals or ions. The inner and outer regions have varying radial widths so as to balance a flow of processing gas over a surface of a substrate. In certain embodiments, the flow equalizer plate may be utilized to correct chamber flow asymmetries due to a lateral offset of an exhaust port relative to a center line of a substrate support between the process volume and the exhaust port.

9 Claims, 6 Drawing Sheets

GAS FLOW EQUALIZER PLATE SUITABLE FOR USE IN A SUBSTRATE PROCESS CHAMBER

BACKGROUND

Embodiments of the present invention relate to the field of semiconductor substrate processing system. More specifically, the invention relates to a gas flow equalizer plate suitable for use in a substrate process chamber.

DESCRIPTION OF THE RELATED ART

As semiconductor devices have increasingly reduced dimensions, process uniformity across a substrate on which the semiconductor devices are formed is paramount to maintaining high yield. Indeed, one problem associated with a conventional plasma etch process applied in the manufacture of semiconductor devices is the non-uniformity of the etch rate across the processed substrate, which may be due, in part, to a lateral offset between the reactive species and the substrate being etched. One factor contributing to the tendency of the reactive species to be offset from the center of the substrate is the radial location of the chamber exhaust port. As gases are more easily pumped from areas of the chamber that are closer to the exhaust port, the reactive species are pulled toward the exhaust port, and thereby become offset with respect to the center of the substrate. This offset contributes to a loss of etch uniformity over the surface of the substrate.

To further illustrate the foregoing issue, FIG. 1 is a schematic cross-sectional view showing a conventional substrate process chamber 100. The process chamber 100 that is coupled to a gas panel 102 and a vacuum pump 104. The process chamber 100 comprises sidewalls 110 and a bottom 112 that partially define a process volume 114 upwardly closed by a lid 116. A substrate support 120 is provided approximately at a central region of the process volume 114 to support a substrate 122 during processing. A gas distribution plate assembly 130 is provided on an inner side of the lid 116 to flow and distribute a processing gas supplied from the gas panel 104. The processing gas is flowed from the gas distribution plate assembly 130 toward the substrate support 120, and is evacuated via an exhaust port 132 coupled to the vacuum pump 104. A throttle valve 134 disposed in the vicinity of the exhaust port 132 is used in conjunction with the vacuum pump 104 to control the pressure in the process volume 114. To ensure that a plasma formed from the processing gas are confined in the process volume 114, a plasma screen plate 140 is provided around the substrate support 120. The plasma screen plate 140 comprises a plurality of slots 142 dimensioned to block the plasma from entering the region of the chamber below the substrate support while permitting the passage of gases to the exhaust port 132.

During operation, while a processing gas is supplied from the gas distribution plate assembly 130 toward the substrate 122 disposed on the substrate support 120, the vacuum pump 104 is operated to evacuate the processing gas that flows through the plasma screen plate 140 to the exhaust port 132. However, because the exhaust port 132 is located offset to the side of the substrate support 120, the flow of processing gas tends to be higher at the side of the substrate support 120 corresponding to the exhaust port 132. As a result, the flow of processing gas between the gas distribution plate assembly 130 and the substrate support 120 is not symmetric. Process uniformity over the surface of the substrate is thus adversely affected.

Therefore, there is a need for an apparatus that can enhance the uniformity of the flow of processing gas over the surface of a substrate during processing.

SUMMARY

Embodiments of the invention provide a gas flow equalizer suitable for use in a substrate process chamber. In one embodiment, the gas flow equalizer plate comprises a plate body having a central opening, wherein the plate body comprises an inner region adjacently surrounding the central opening, and a perforated outer region surrounding the inner region. The inner region has a first radial width varying along a circumference of the plate body to obstruct a flow of processing gas incident to the inner region, and the perforated outer region has a second radial width varying along the circumference of the plate body through which a flow of gas is permitted.

In another embodiment, a substrate process chamber with improved gas flow uniformity is provided. The process chamber comprises a process volume located between a substrate support and a ceiling of the process chamber, a vacuum pump that is coupled to an exhaust port located at a lateral side of the substrate support, and a gas flow equalizer plate mounted around the substrate support. The gas flow equalizer plate comprises a plate body having an inner region adjacently surrounding the substrate support, and a perforated outer region surrounding the inner region. The inner region has a first radial width varying along a circumference of the plate body to obstruct a flow of gas incident to the inner region, and the perforated outer region has a second radial width varying along the circumference of the plate body through which a flow of gas is permitted.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments described herein provide a flow equalizer plate suitable for use in a substrate process chamber. The substrate process chamber comprises a substrate support, a gas distributor, a process volume defined between the substrate support and a ceiling of the process chamber, and a vacuum pump coupled to an exhaust port located at a lateral side of the substrate support. The flow equalizer plate is disposed around the substrate support above the exhaust port and below the gas distributor. The flow equalizer plate has an annular shape with a flow obstructing inner region, and a perforated outer region that permits the passage of a processing gas, but prevents the passage of plasma therethrough. The open area of outer region varies in different sections of the plate so as to equalize a flow of processing gas passing along the edge of the substrate while flowing from the process volume to the exhaust port. Process uniformity over the surface of the substrate can thereby be improved.

Figure 1:
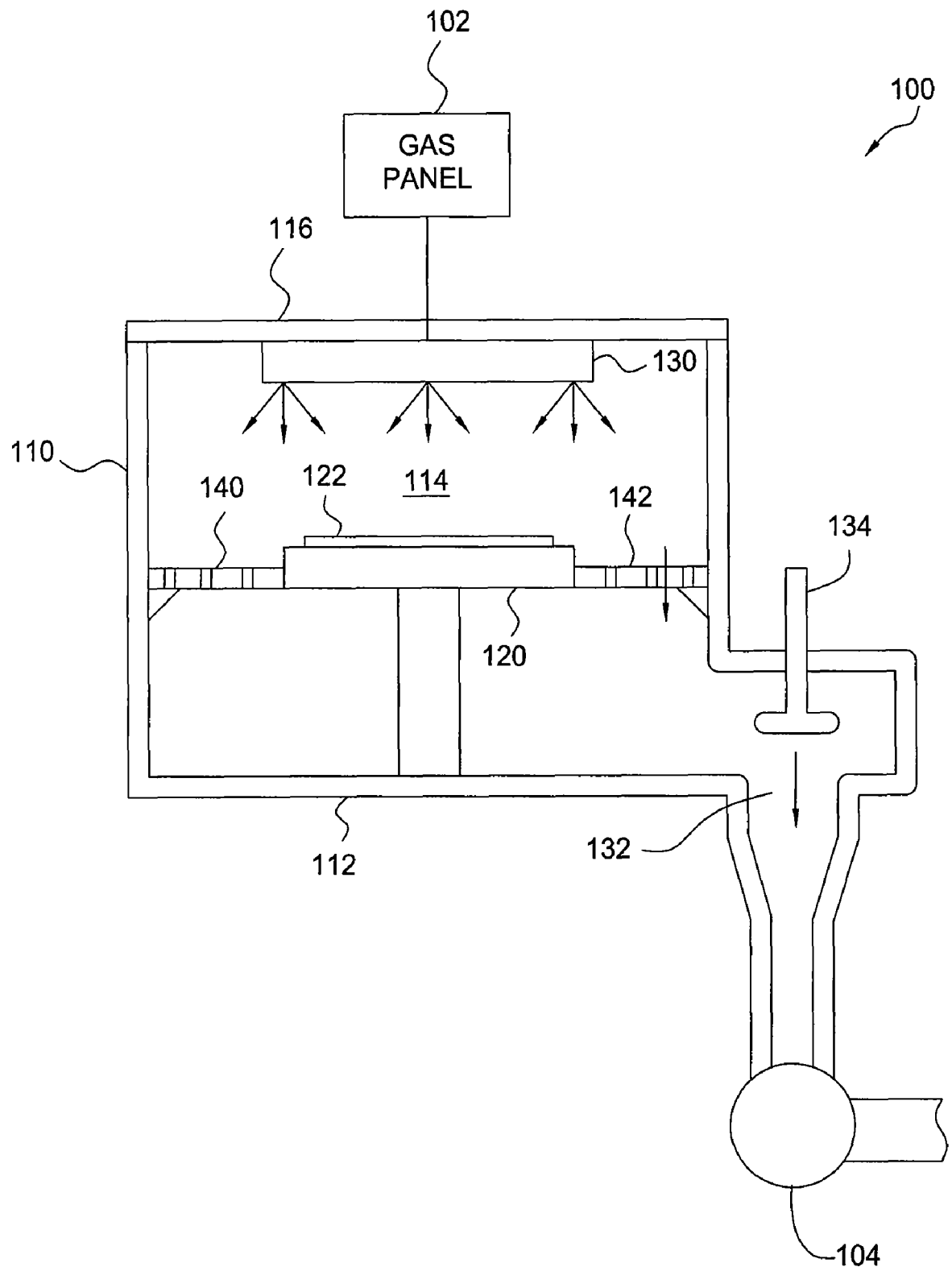
FIG. 1 is a simplified cross-sectional view of a conventional substrate process chamber.
Figure 2A:
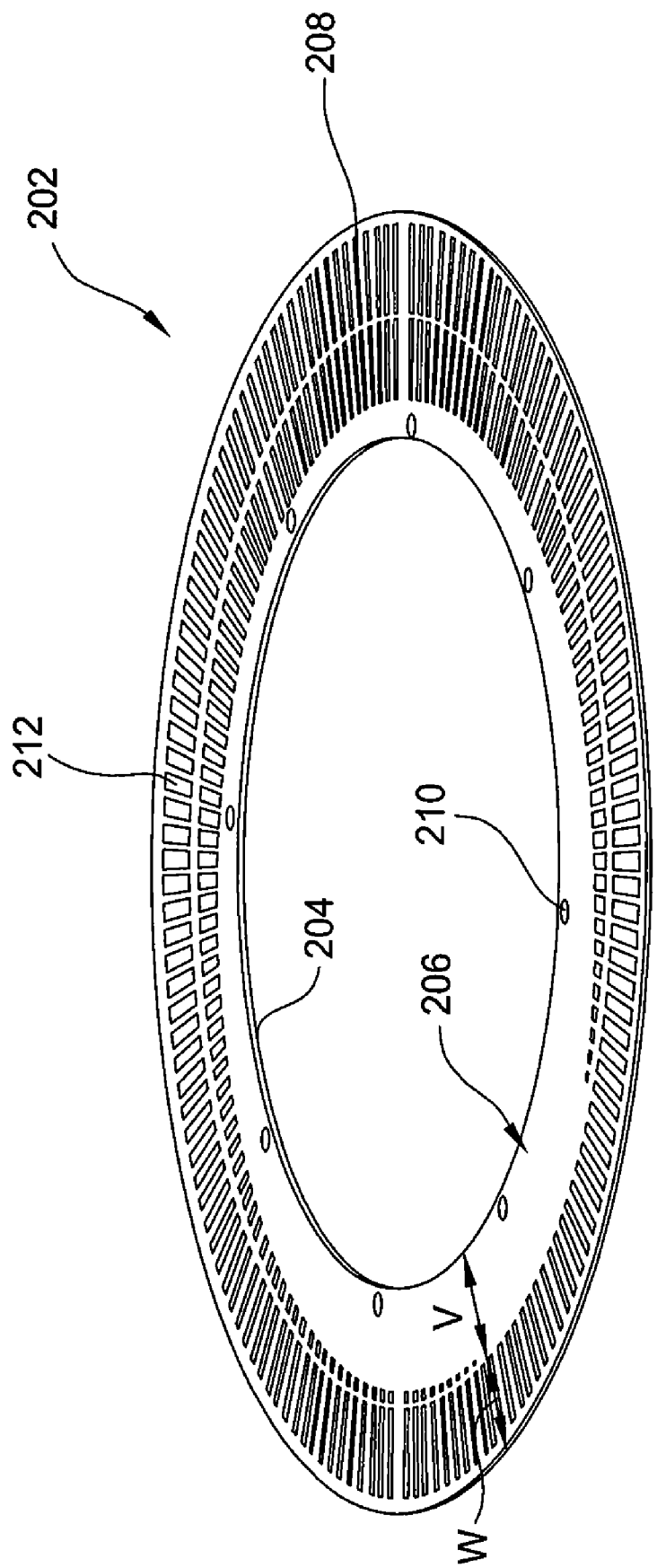
FIG. 2A is an isometric view of an embodiment of a flow equalizer plate.
Figure 2B:
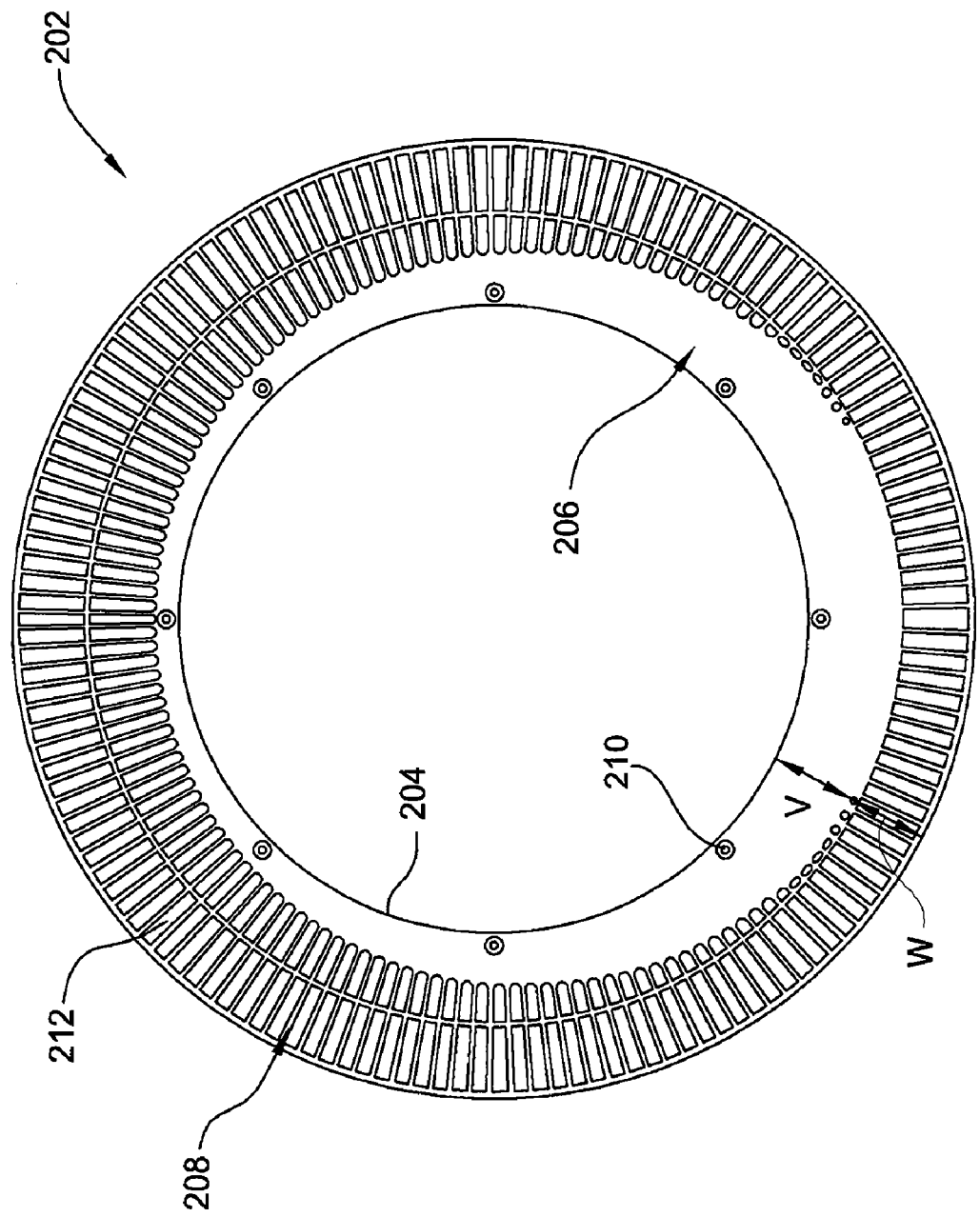
FIG. 2B is a plan view of the flow equalizer plate of FIG. 2A.

FIGS. 2A and 2B are schematic views showing one embodiment of a flow equalizer plate 202. The flow equalizer plate 202 has an annular shape provided with a central opening 204 corresponding to the placement of a substrate support assembly. In one embodiment, the flow equalizer plate 202 may be made of silicon carbide (SiC). In other embodiments, the flow equalizer plate 202 may be made of Yttrium-containing materials, such as Yttrium oxide ($Y_2O_3$). The flow equalizer plate 202 generally has an asymmetrical distribution of open area around the plate such that the flow through the plate may be tuned to correct flow asymmetries over the substrate.

In one embodiment, the flow equalizer plate 202 is divided into a non-flow permeable inner region 206 adjacent to the rim of the central opening 204, and a perforated outer region 208 surrounding the inner region 206. The inner region 206 is formed of a solid material that has a radial width V varying between a smallest width $V_{min}$ and a greatest width $V_{max}$ along the circumference of the flow equalizer plate 202 for blocking gas flowing. Holes 210 may be disposed in the inner region 206 around the central opening 204 for attachment of the flow equalizer plate 202 in a process chamber. It is also contemplated that the inner region 206 may be perforated while the outer region 208 may be solid.

The outer region 208 includes a plurality of apertures arranged to allow more flow through one side of the plate 202 so as to balance the flow across the surface of the substrate. The apertures may have various shapes or forms suitable for controlling the flow of gas therethrough while restricting the passage of plasma. In one embodiment, the apertures are mainly composed of a plurality of contiguous slots 212 disposed around the inner region 206. In one embodiment, the width of each slot 212 may be smaller than the thickness or width of a plasma sheath, so that neutrals in the plasma can pass through the slots 212 while ions and radicals are blocked.

Figure 2C:
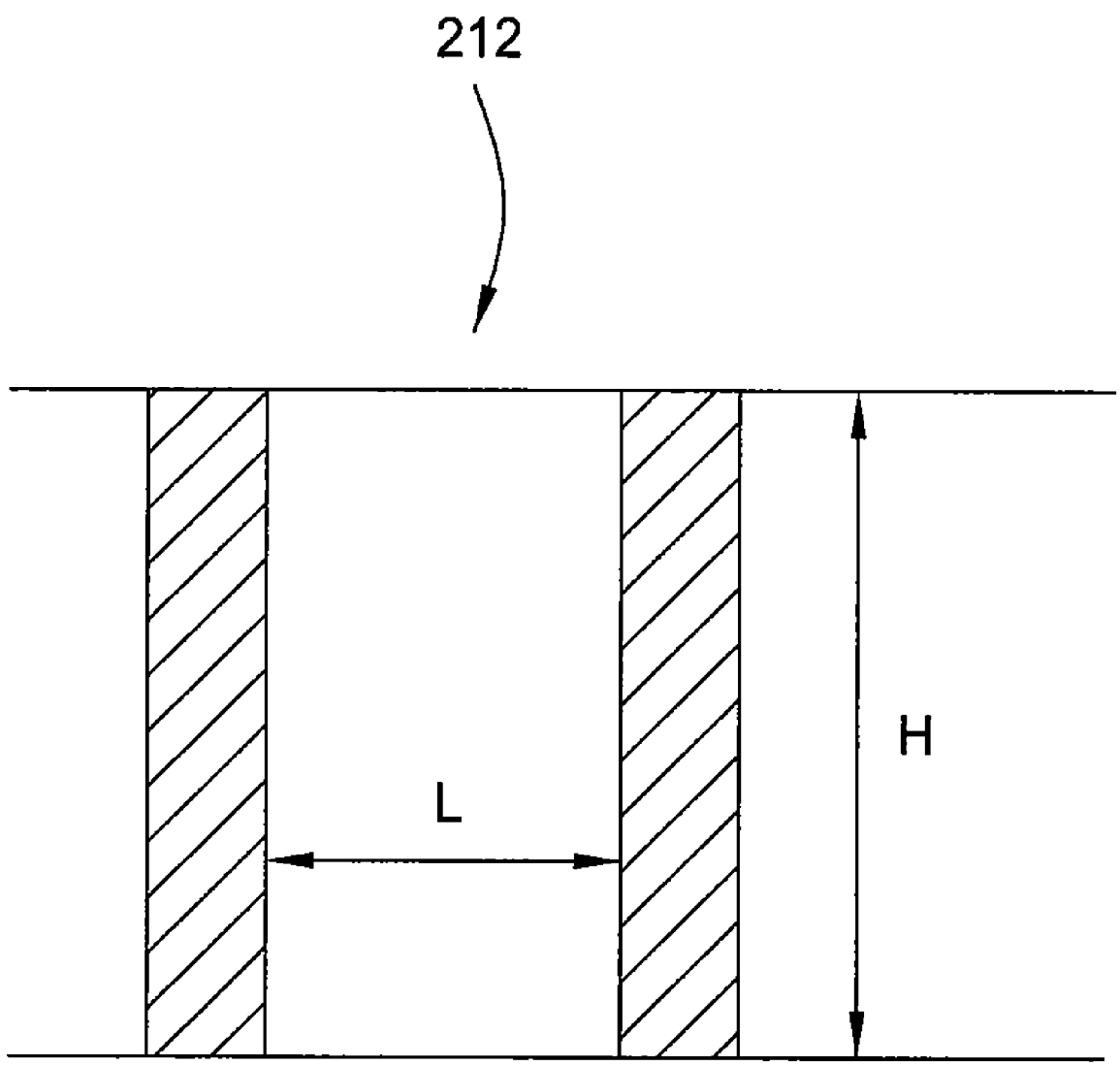
FIG. 2C is a schematic cross-sectional view of one embodiment of one of the slots provided in the flow equalizer plate.

The slots 212 may have orientations other than the radial orientation shown in FIG. 2B. FIG. 2C is a schematic cross-sectional view of one embodiment of one slot 212. In one embodiment, the width L of each slot 212 may range between about 3 mm and about 4 mm, and the height H of each slot 212 may range between about 12 mm and about 15 mm.

Referring back to FIG. 2B, the outer region 208 has a radial width W varying between a smallest width $W_{min}$ and a greatest $W_{max}$ along the circumference of the flow equalizer plate 202. In one embodiment, the smallest width portion $V_{min}$ of the inner region 206 is smaller than the smallest width portion $W_{min}$ of the outer region 208, and the greatest width portion $V_{max}$ of the inner region 206 is smaller than the greatest width portion $W_{max}$ of the outer region 208. In one embodiment, the radial width V of the inner region 206 and radial width W of the outer region 208 may complementarily vary along the circumference of the flow equalizer plate 202 to equalize a flow of processing gas that passes through it when used in a processing chamber having a pumping port disposed outset from the center of the substrate support.

The difference with width of the slots (or other aperture of other geometric form) around the outer region 208 results in more open area to one side of the plate 202 relative to another side of the plate. This allows the side of the plate 202 having the smallest open area to be positioned proximate and/or over the pumping port of the processing chamber, with the region of greatest open area being located 180 degrees from the exhaust port, to counter balance the pumping asymmetries due to the offset location of the exhaust port. It is also contemplated that the regions of greatest and least open area may not be 180 degrees apart on the plate 202 or positioned relative to the exhaust port as described above if conductance of a processing chamber requires restriction of the flow across the plate 202 to be selected to produce a desired effect.

Figure 3A:
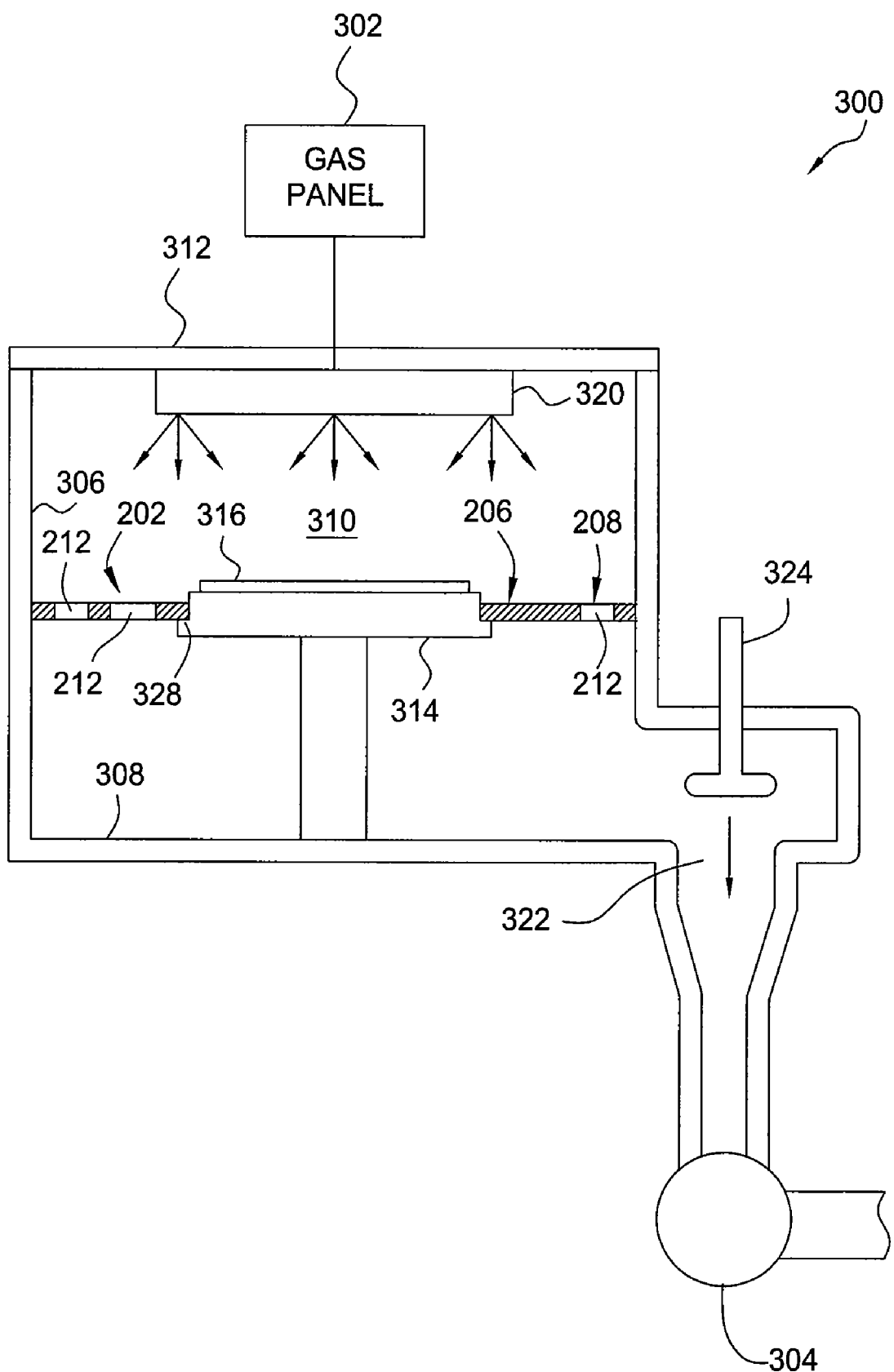
FIG. 3A is a cross-sectional view illustrating one embodiment of a substrate process chamber using the flow equalizer plate.

FIG. 3A is a schematic cross-sectional view illustrating one embodiment of a process chamber 300 using the flow equalizer plate 202. The process chamber 300 is coupled to a gas panel 302 and a vacuum pump 304. The process chamber 300 has a chamber body comprising sidewalls 306 and a bottom 308 that partially define a process volume 310 upwardly closed by a lid 312. A substrate support 314 is provided approximately at a central region of the process volume 310 to support a substrate 316 during processing. One or more gas distributors are disposed in the chamber above the substrate support 314 to provide process and other gases into the process volume 310. The gas distributor may be one or more nozzles or ports formed in the chamber lid. In the embodiment depicted in FIG. 3, the gas distributor is a gas distribution plate assembly 320 provided on an inner side of the lid 312 to flow and distribute a processing gas supplied from the gas panel 302. The processing gas is flowed from the gas distribution plate assembly 320 toward the substrate support 314, and is evacuated via the vacuum pump 304 through an exhaust port 322 located offset to the side of the substrate support 314. A throttle valve 324 disposed in the vicinity of the exhaust port 322 is used in conjunction with the vacuum pump 304 to control the pressure in the process volume 310. The flow equalizer plate 202 is installed around the substrate support 314, for example fixed to a ledge or step 328 formed on the outer diameter of the substrate support.

Figure 3B:
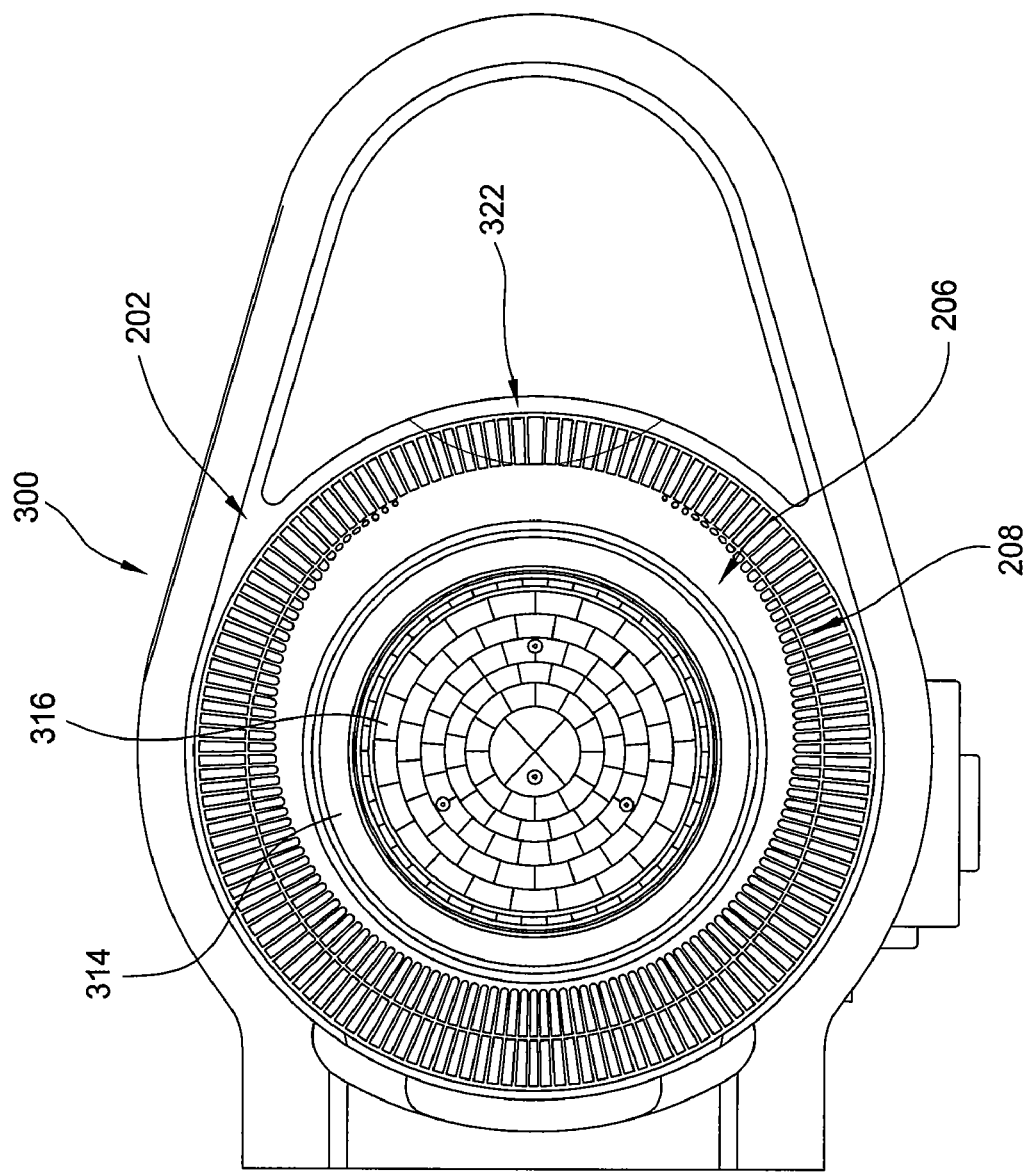
FIG. 3B is a top planar view of the process chamber of FIG. 3A showing how the flow equalizer plate is oriented around the substrate support.

FIG. 3B is a top planar view illustrating how the flow equalizer plate 202 is oriented around the substrate support 314. In one embodiment, the flow equalizer plate 202 may be arranged so that the greatest width portion $V_{max}$ of the inner region 206 and the smallest width portion $W_{min}$ of the outer region 208 are located on the side of the exhaust port 322, for example, directly above the exhaust port 322, and the smallest width portion Vmin of the inner region 206 and the greatest width portion Wmax of the outer region 208 are located on a side radially opposite the side of the exhaust port 322. When a processing gas is supplied from the gas distribution plate assembly 320 and the vacuum pump 304 is operated to evacuate the processing gas via the exhaust port 322, maximum flow restriction is thus provided on the side of the exhaust port 132. As a result, symmetric flow of the processing gas across the surface of the substrate disposed on the substrate support 314 can be obtained.

It is also contemplated that the rotational offset in the horizontal plane relative the location of the exhaust port and/or the inclination of the plate 202 may be selected to correct flow asymmetries beyond that due to exhaust port location. It is also contemplated that it may be desirable to use the plate 202 to introduce asymmetric flow across the substrate if desired.

While the foregoing is directed to embodiments of the present invention, other and further embodiments of the invention thus may be devised without departing from the basic scope thereof, and the scope thereof is determined by the claims that follow.

What is claimed is:

1. A process chamber comprising:
   a chamber body having a process volume disposed between a substrate support disposed in the chamber body and a ceiling of the chamber body;
   a vacuum pump that is coupled to an exhaust port located at one lateral side of the substrate support; and
   a substantially flat gas flow equalizer plate circumscribing the substrate support, wherein the gas flow equalizer plate comprises:
      a plate body having an inner region and an outer region that each has a constant radial width along the circumference of the plate body, the outer region is concentric with the inner region and having a first radial width along a circumference of the plate body and a plurality of first slots circumscribing the inner region, the plurality of first slots extending radially substantially across the first radial width and being configured to prevent the passage of plasma therethrough, the inner region comprising a slotted portion and a non-slotted portion adjacently surrounding the substrate support, the slotted portion having a plurality of second slots surrounding at least a portion of the non-slotted portion,
   wherein the slotted portion is concentric with the non-slotted portion;
   wherein the non-slotted portion has a second radial width that gradually decreases along the circumference of the plate body within the slotted portion to obstruct a flow of gas incident to the inner region;
   wherein the slotted portion has a third radial width inversely varying relative to the second radial width along the circumference of the plate body through which a flow of gas is permitted therethrough; and
   wherein the plurality of second slots extend radially substantially across the second radial width and are configured to prevent the passage of plasma therethrough.

2. The process chamber of claim 1, wherein the inner region of the plate body is oriented around the substrate support and the plate body is fixed to the outer diameter of the substrate support.

3. The process chamber of cairn 1, wherein the inner region and the outer region are contiguous to each other.

4. The process chamber of claim 1, wherein the gas flow equalizer plate comprises yttrium oxide.

5. The process chamber of claim 1, wherein a width of each of the plurality of the first and second slots ranges between about 3 mm and about 4 mm.

6. The process chamber of claim 1, wherein a height of each of the plurality of the first and second slots ranges between about 12 mm and about 15 mm.

7. The process chamber of claim 1, wherein the plate body is oriented so that a maximum of the second radial width and a minimum of the third radial width lie on the lateral side of the exhaust port.

8. The process chamber of claim 1, wherein a minimum of the third radial width is directly above the exhaust port.

9. The process chamber of claim 1, wherein the slotted portion has an greater open area directly above the exhaust port.

* * * * *

UNITED STATES PATENT AND TRADEMARK OFFICE
CERTIFICATE OF CORRECTION

PATENT NO.        : 8,075,728 B2                                           Page 1 of 1
APPLICATION NO.   : 12/038887
DATED             : December 13, 2011
INVENTOR(S)       : Balakrishna et al.

It is certified that error appears in the above-identified patent and that said Letters Patent is hereby corrected as shown below:

In the Claims:

Column 6, Claim 3, Line 17, please delete "cairn" and insert --Claim-- therefor.

Signed and Sealed this
Twenty-first Day of February, 2012

David J. Kappos
*Director of the United States Patent and Trademark Office*